(12) United States Patent
Purkl et al.

(10) Patent No.: US 10,563,306 B2
(45) Date of Patent: Feb. 18, 2020

(54) PRODUCTION METHOD FOR A LAYER STRUCTURE AND LAYER STRUCTURE

(71) Applicant: Robert Bosch GmbH, Stuttgart (DE)

(72) Inventors: Fabian Purkl, Rutesheim (DE); Franziska Rohlfing, Leonberg (DE); Robert Roelver, Calw-Stammheim (DE); Theresa Lutz, Ottobrunn (DE)

(73) Assignee: Robert Bosch GmbH, Stuttgart (DE)

( * ) Notice: Subject to any disclaimer, the term of this patent is extended or adjusted under 35 U.S.C. 154(b) by 445 days.

(21) Appl. No.: 15/401,706

(22) Filed: Jan. 9, 2017

(65) Prior Publication Data

US 2017/0198398 A1 Jul. 13, 2017

(30) Foreign Application Priority Data

Jan. 13, 2016 (DE) ........................ 10 2016 200 262

(51) Int. Cl.
| | |
|---|---|
| *C23C 16/56* | (2006.01) |
| *C23C 16/26* | (2006.01) |
| *H01B 1/04* | (2006.01) |
| *H01B 5/14* | (2006.01) |

(52) U.S. Cl.
CPC .............. *C23C 16/56* (2013.01); *C23C 16/26* (2013.01); *H01B 1/04* (2013.01); *H01B 5/14* (2013.01)

(58) Field of Classification Search
CPC ........... C23C 16/56; C23C 16/26; H01B 1/04; H01B 5/14
See application file for complete search history.

(56) References Cited

U.S. PATENT DOCUMENTS

| | | | |
|---|---|---|---|
| 2012/0168724 A1* | 7/2012 | Park | H01L 21/8258 257/29 |
| 2012/0258311 A1 | 10/2012 | Hong et al. | |
| 2014/0270271 A1* | 9/2014 | Dehe | B81B 3/0018 381/174 |

* cited by examiner

*Primary Examiner* — Duy Vu N Deo
(74) *Attorney, Agent, or Firm* — Norton Rose Fulbright US LLP; Gerard Messina

(57) ABSTRACT

A production method for a layer structure, including providing a substrate, wherein at least a top surface of the substrate is made from a non-conductive material; depositing a catalyst structure onto the top surface of the substrate; depositing a graphene structure onto the catalyst structure; and at least partially removing the catalyst structure situated between the substrate and the graphene structure.

5 Claims, 6 Drawing Sheets

PRODUCTION METHOD FOR A LAYER STRUCTURE AND LAYER STRUCTURE

CROSS REFERENCE

The present application claims the benefit under 35 U.S.C. § 119 of German Patent Application No. DE 102016200262.7 filed on Jan. 13, 2016, which is expressly incorporated herein by reference in its entirety.

FIELD

The present invention relates to a production method for a layer structure and to a layer structure.

BACKGROUND INFORMATION

Because of its excellent electrical and mechanical properties, especially its extremely high charge carrier mobility, graphene is eminently suitable for a multitude of different application fields. However, the production methods are frequently cost-intensive. In addition, it is difficult to produce graphene directly on large areas of a desired target substrate.

U.S. Patent Application Pub. No. 2012/0258311 A1 describes a production method for a graphene layer, in which graphene is first grown on an auxiliary structure and then is transferred to a target structure with the aid of a roll-on operation.

SUMMARY

The present invention provides a production method for a layer structure, which has a first method step of providing a substrate, in which at least a top surface of the substrate consists of an electrically non-conductive, especially electrically insulating, material. In addition, the production method includes the deposition of a catalyst structure on the top surface of the substrate, the deposition of a graphene structure on the catalyst structure, as well as the at least partial removal of the catalyst structure situated between the substrate and graphene structure.

According to a further aspect, the present invention provides a layer structure having a substrate, at least a top surface of the substrate consisting of a non-conductive material, and a graphene structure developed above the top surface of the substrate, the graphene structure being at least partially set apart from the substrate.

Preferred further developments of the present invention are described herein.

Because of the production method according to the present invention, a transfer of the graphene structure onto the target substrate is completely avoided. Instead, the graphene structure is already developed directly on the desired substrate with the aid of a catalytic growth on a catalyst structure. By avoiding the transfer, the quality of the graphene structure is able to be increased considerably, which clearly improves the electronic properties of the graphene structure. In particular, a defect density is able to be reduced and tears or interference points at the edges of the layer structure may be prevented. The monocrystalline characteristic of the graphene structure is improved. Impurities that are created by a transfer process are avoided in addition.

Furthermore, a graphene structure having any desired predefined structure is able to be produced, for instance by structuring the catalyst structure. This especially allows for a decrease in the growth period for depositing the graphene structure since graphene is deposited only at the particular locations in which a coating is required. Subsequent structuring of the graphene structure may therefore be dispensed with. In particular, damage to the graphene structure at the edges, which may be caused by the structuring, is able to be reduced.

According to a preferred further development, the production method includes the development of at least one electrically conductive contact on at least a subregion of the graphene structure. The electrically conductive contact is able to support the graphene structure so that it is even possible to produce graphene diaphragms.

According to a preferred further refinement, the production method includes the development of an upper protective coating on at least a subregion of the electrically conductive contact and/or the graphene structure. The upper protective coating may protect against chemical and physical influences, in particular.

According to a preferred further refinement, the production method includes the removal of a subregion of the graphene structure that is not covered by the upper protective coating, prior to the at least partial removal of the catalyst structure. This ensures that the catalyst structure situated between substrate and graphene structure is easily accessible, which means that the catalyst structure is able to be removed in an uncomplicated manner, especially by etching.

According to a preferred further refinement, the production method includes the exposing of the substrate from the direction of an underside situated opposite from the top surface of the substrate so that the catalyst structure is at least regionally exposed; during the partial removal of the catalyst structure, the graphene structure is at least regionally exposed. This makes it possible to produce a graphene diaphragm, in particular.

According to a preferred further refinement, the production method includes the development of a lower protective coating made of an electrically insulating material on at least a subregion of the underside of the substrate and/or the exposed graphene structure. The lower protective coating is preferably made of a material that does not change the electrical properties of the graphene structure. The lower protective coating ensures that the quality of the graphene structure does not deteriorate.

According to a preferred further refinement, the production method includes the development of a contact coating of an electrically conductive material on at least a subregion of the underside of the substrate and the exposed graphene structure. This makes it possible, in particular, to produce a graphene structure that is able to be contacted from both sides of the substrate.

According to a preferred further refinement of the layer structure, the substrate has a recess in a subregion that is situated underneath the graphene structure.

BRIEF DESCRIPTION OF THE DRAWINGS

FIG. 4a through 4h show illustrations of a production method for a layer structure according to a third specific embodiment of the present invention.

DETAILED DESCRIPTION OF EXAMPLE EMBODIMENTS

Figure 1:
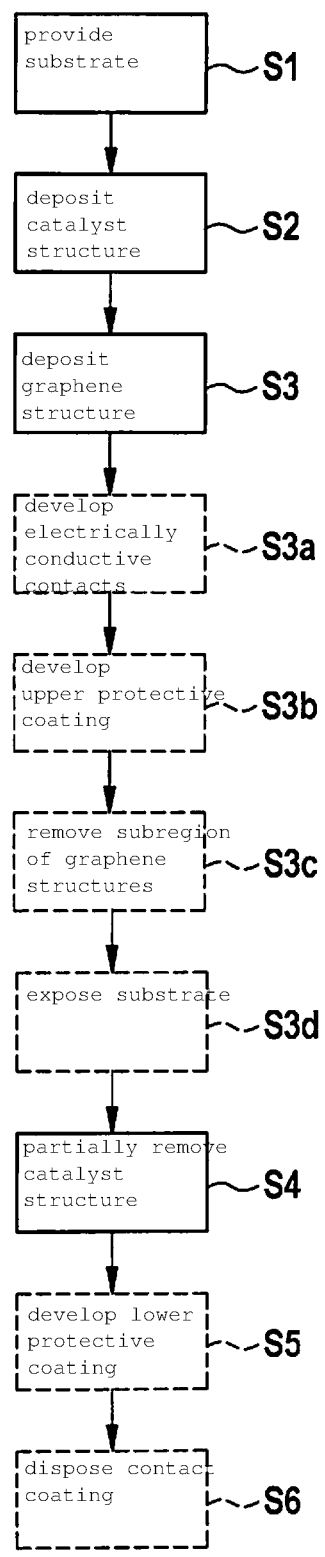
FIG. 1 shows a flow diagram to elucidate a production method for a layer structure according to specific embodiments of the present invention.

Unless otherwise noted, identical of functionally equivalent elements and devices have been provided with the same reference numerals in all of the figures. The numbering of method steps is provided for reasons of clarity and, unless otherwise noted, especially is not meant to imply a specific time sequence. In particular, it is also possible to perform multiple method steps at the same time. In addition, different specific embodiments are able to be combined as desired unless otherwise noted.

FIG. 1 shows a flow diagram to elucidate a production method for a layer structure.

Method steps according to a first specific embodiment of the present invention are illustrated in FIGS. 2a through 2e. In a first method step S1, a substrate 1 is provided. Substrate 1 has a top surface 1a, which is electrically insulating. Preferably, even the entire substrate may be electrically insulating. For example, the substrate may be made of silicon, graphite, quartz, sapphire or glass. In particular, the substrate may be a silicon wafer having a silicon-dioxide layer.

Figure 2A:
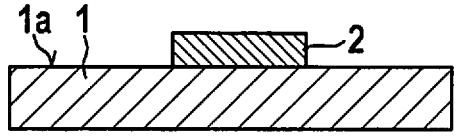
FIG. 2a through 2e show illustrations of a production method for a layer structure according to a first specific embodiment of the present invention.
Figure 2A:
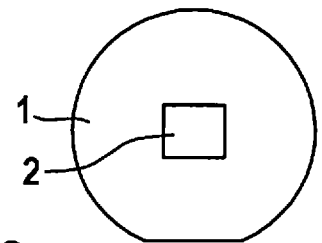

In a second method step S2, a catalyst structure 2 is deposited onto top surface 1a of substrate 1. Catalyst structure 2 may include copper, platinum, nickel or germanium, in particular. Catalyst structure 2 is used as catalyst for growing graphene. Preferably, catalyst structure 2 is able to be developed as coating and structured. The left side of FIG. 2a shows a cross-sectional view, and the right side depicts a plan view of substrate 1 including deposited catalyst structure 2. The deposition of catalyst structure 2, for example, is able to take place with the aid of a lift-off process, for example, and/or through the use of a shadow mask and/or in a sputtering process and/or a vaporization process and/or by dry-chemical etching and/or wet-chemical etching. A layer thickness of catalyst structure 2 preferably lies between 10 and 5000 nm in this context.

Figure 2B:
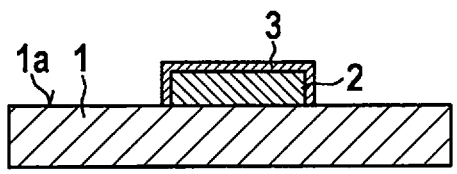
Figure 2B:
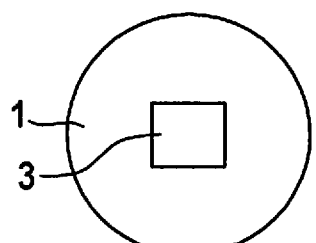

In a third step S3 illustrated in FIG. 2b, a graphene structure 3 is deposited on catalyst structure 2. Graphene structure 3 is preferably deposited or grown on catalyst structure 2 with the aid of a chemical gas-phase deposition process (CVD process).

Figure 2C:
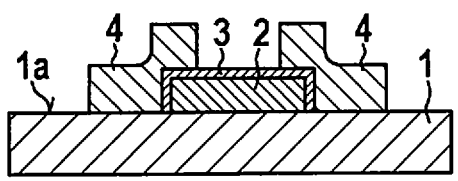
Figure 2C:
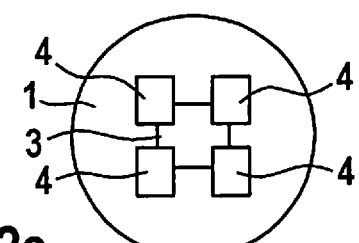

In an optional method step S3a, electrically conductive contacts 4 are able to be developed in at least a subregion of graphene structure 3 in each case. This is illustrated in FIG. 2c. To do so, a respective conductive contact 4 is developed at each corner of rectangular graphene structure 3, and the conductive contacts 4 contact graphene structure 3 and fixate it at the same time. Conductive contacts 4 may be developed by sputtering and/or with the aid of a shadow mask, for instance. Conductive contacts 4 are preferably produced from a non-magnetic metal and preferably include copper and/or gold and/or platinum and/or aluminum.

Figure 2D:
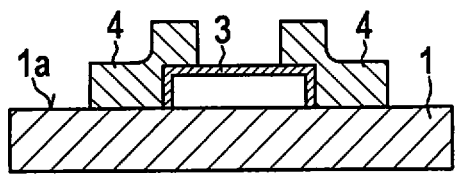

In a further method step S4, illustrated in FIG. 2d, catalyst structure 2 situated between substrate 1 and graphene structure 3 is at least partially removed. Catalyst structure 2 is preferably removed with the aid of an etching solution that is selected as a function of the material of catalyst structure 2. For example, ferric chloride $FeCl_3$ may be used for removing a catalyst structure 2 of copper, for example. Conductive contacts 4 are preferably made from a material that is resistant to etching solutions so that conductive contacts 4 are not attacked or destroyed when catalyst structure 2 is removed. To give the etching solution access to catalyst structure 2, catalyst structure 2 preferably does not surround graphene structure 3 completely. In particular, side areas of catalyst structure 2 that are at a right angle to the substrate may have one or multiple area(s) that is/are not covered by graphene structure 3 where catalyst structure 2 is exposed and the etching solution therefore has access to catalyst structure 2. This may be achieved by a precision adjustment of a deposition time of graphene structure 3 on catalyst structure 2, in particular.

FIG. 2d shows a layer structure 10, which was produced according to a production method according to the first specific embodiment. Graphene structure 3 is inserted between conductive contacts 4 so that a diaphragm is formed which is set apart from substrate 1. Graphene structure 3 is thus at least partially set apart from substrate 1, which means that at least a subregion of a side of graphene structure 3 facing substrate 1 is spaced apart from a plane that is spanned by top surface 1a of substrate 1.

Figure 2E:
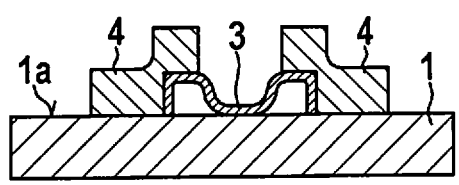

However, it is also possible to produce a layer structure 20, as illustrated in FIG. 2e, as a function of a mechanical tension of graphene structure 3 according to the production method according to the first specific embodiment. Graphene structure 3 has at least partially dropped down to substrate 1 and contacts substrate 1 after catalyst structure 2 has been removed.

FIG. 3 illustrates a production method for a layer structure according to a second specific embodiment of the present invention. Following step S3a of developing a conductive contact 4, an upper protective coating 5 is additionally developed on at least a subregion of conductive contact 4 and graphene structure 3 in a step S3b. Upper protective coating 5 preferably has a thickness between ten nanometers and one hundred micrometers. Upper protective coating 5 is preferably a polymer layer. For example, upper protective coating 5 may include silicon oxide. Upper protective coating 5 is preferably structured in such a way that a lateral region of graphene structure 3 is spared by upper protective coating 5. FIG. 3a shows a corresponding cross-sectional view on the left side, and a corresponding plan view on the right side.

Figure 3A:
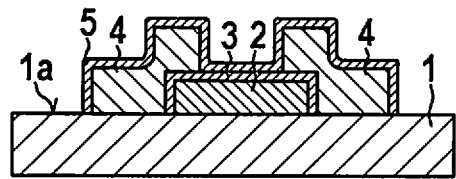
FIG. 3a, b show illustrations of a production method for a layer structure according to a second specific embodiment of the present invention.
Figure 3A:
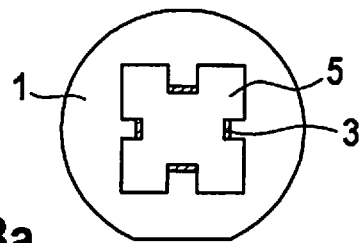
Figure 3B:
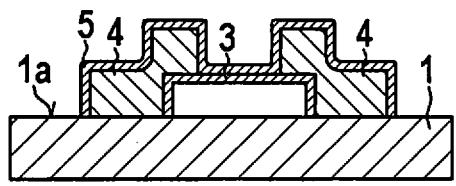
Figure 3B:
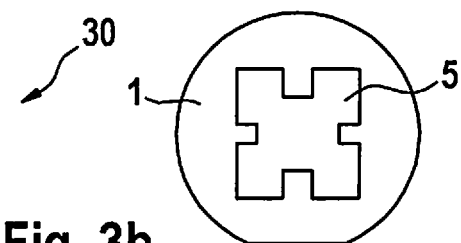

In a further step S3c, the subregion of graphene structure 3 not covered by upper protective coating 5 is now removed, for instance with the aid of an oxygen plasma. This provides an access to catalyst structure 2. Then, catalyst structure 2 situated between substrate 1 and graphene structure 3 is at least partially removed, as in the first specific embodiment described above, whereby access of an etching fluid to catalyst structure 2 is ensured via the areas of graphene structure 3 that have been exposed. FIG. 3b illustrates a corresponding cross-sectional view and a plan view of a layer structure 30, which was produced by the production method according to the second specific embodiment.

FIG. 4 illustrates a production method for a layer structure according to a third specific embodiment of the present invention. The left side of FIG. 4a corresponds to a cross-sectional view along an A-B axis of a plan view of a top surface 1a of the substrate illustrated on the right side of FIG. 4a. In contrast to the production methods illustrated in FIGS. 2 and 3, catalyst structure 2' is not structured rectangularly in method step S2 but has additional rectangular recesses at respective corners of a rectangle, which are used for the electrical contact of the graphene structure in the finished structure.

Figure 4A:
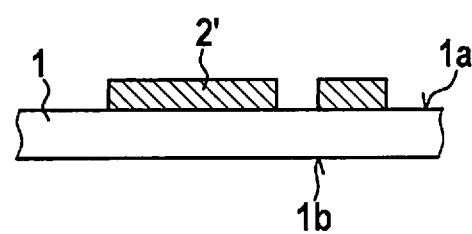
Figure 4A:
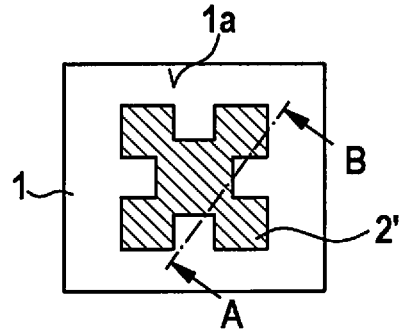
Figure 4B:
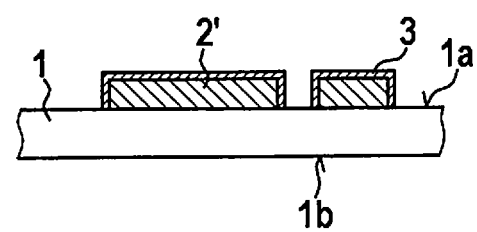
Figure 4B:
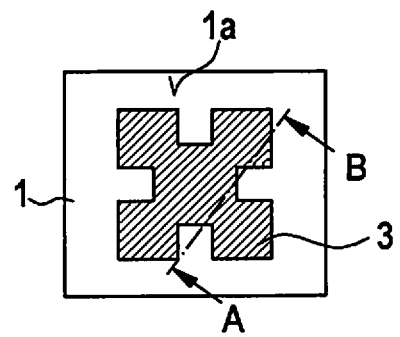

Analogous to the aforedescribed method, a graphene structure 3 is deposited on catalyst structure 2' in a method step S3, as illustrated in FIG. 4b.

In a step S3b, an upper protective coating 5' is developed on graphene structure 3, as illustrated in FIG. 4c. Protective coating 5' is preferably a polymer coating.

Upper protective coating 5' and graphene structure 3 are removed in an outer edge region; a wet-chemical etching process may be used for this purpose, which can also be carried out in two steps. As a result, catalyst structure 2' is exposed in the edge region and may be used for contact graphene structure 3, as illustrated in FIG. 4d.

Figure 4E:
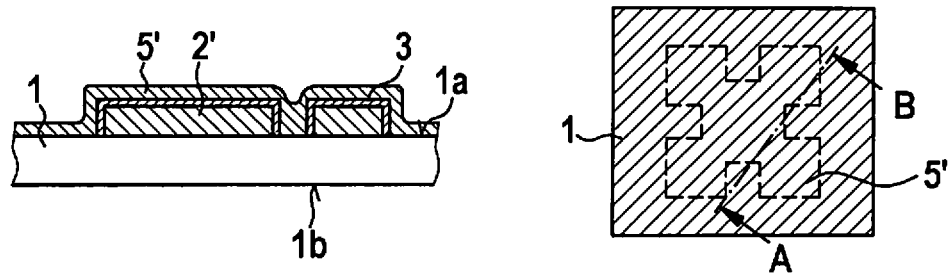
Figure 4E:
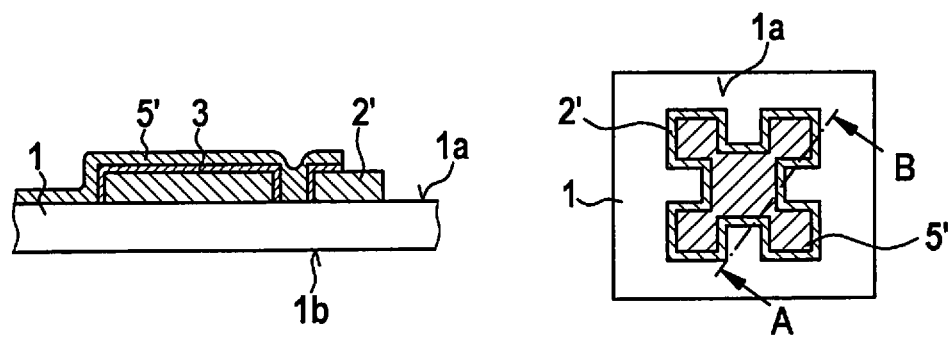
Figure 4E:
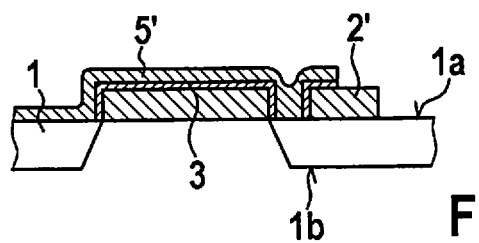

FIG. 4e illustrates a further method step S3d, in which substrate 1 is exposed from the direction of an underside 1b that is situated opposite from top surface 1a of substrate 1. For this purpose, a wet-chemical process with KOH and/or a dry-chemical process may be employed, in particular.

Furthermore, catalyst structure 2' is removed from the direction of underside 1b in a step S4, for which an etching process may be used once again. This exposes graphene structure 3 from the direction of underside 1b of substrate 1, whereby a recess 13 is produced.

Figure 4F:
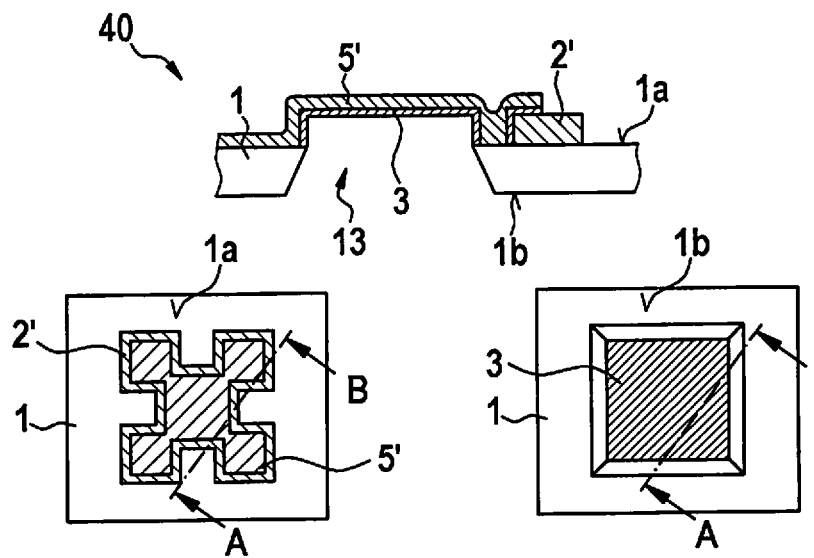

FIG. 4f illustrates a layer structure 40, which was produced according to a production method according to the third specific embodiment. FIG. 4f shows a cross-sectional view, a plan view of underside 1b of substrate 1, and a plan view of top surface 1a of substrate 1.

Figure 4G:
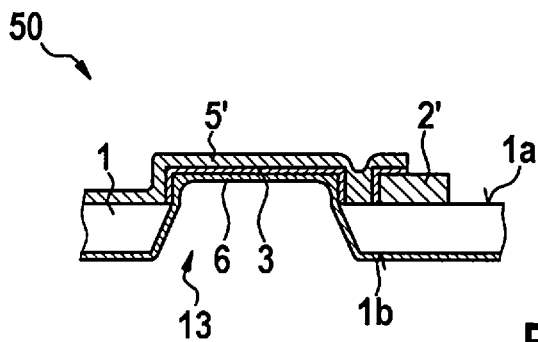

The method may include an optional further step S5 of developing a lower protective coating 6 of an insulating material on graphene structure 3 exposed from the direction of underside 1b of substrate 1. Lower protective coating 6 in particular may consist of boron nitrate BN and/or silicon oxide and/or photoresist. Such a layer structure 50 is illustrated in FIG. 4g. Lower protective coating 6 may preferably have a thickness of several micrometers. Lower protective coating 6 passivates graphene structure 3 with respect to environmental influences without negatively affecting the electrical properties of graphene structure 3.

Figure 4H:
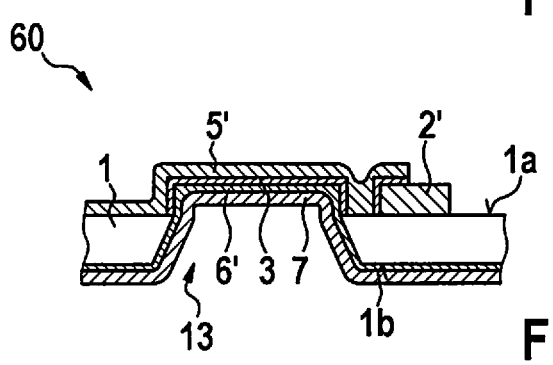

Optionally, the production method is able to include a further method step S6, in which a contact coating 7 of a conductive material may be disposed in addition to a lower protective coating 6' that preferably has a thickness between one nanometer and a few 100 nanometers. Such a device 60 is illustrated in FIG. 4h. A back gate voltage is able to be applied to graphene structure 3 via contact coating 7.

FIG. 5 illustrates a production method according to a fourth specific embodiment of the present invention. Substrate 1' shown in FIG. 5a and provided in a first step S1, in this case includes a thicker first layer 12 and a thinner second layer 11, which forms a top surface 1a of substrate 1'. For example, first layer 12 may be made up of an electrically conductive material, such as silicon or graphite, while second layer 11 is made from an insulating material, especially silicon dioxide, boron nitride or aluminum oxide.

Figure 5A:
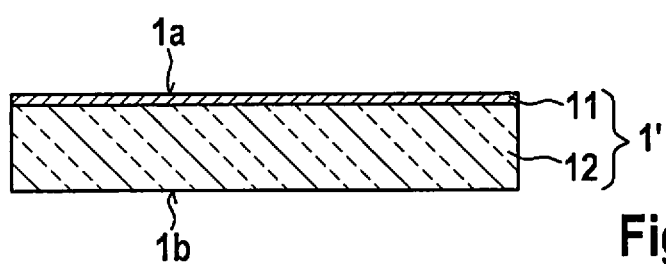
FIG. 5a through 5f show illustrations of a production method for a layer structure according to a fourth specific embodiment of the present invention.
Figure 5B:
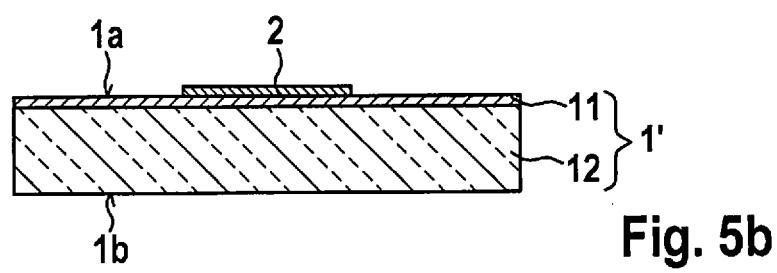

Analogous to the specific embodiments described above, a catalyst structure 2 is deposited onto top surface 1a of substrate 1' in a second step S2, as illustrated in FIG. 5b.

Figure 5C:
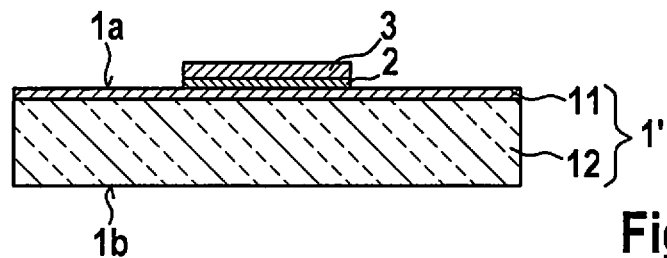
Figure 5D:
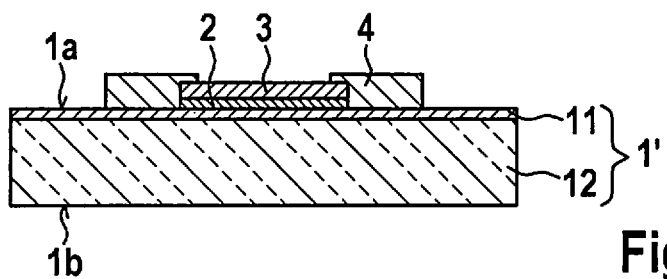
Figure 5E:
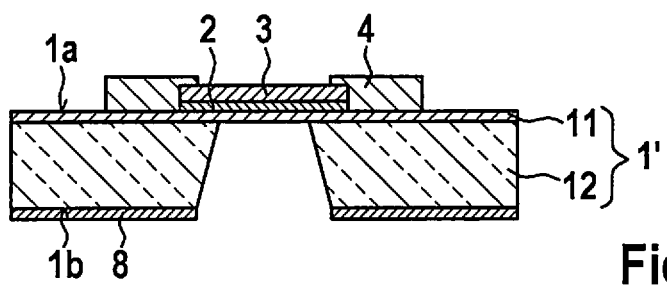

As shown in FIG. 5c, a graphene structure 3 is furthermore deposited onto catalyst structure 2 in a step S3. In a step S3a, conductive contacts 4 are placed at the edges of graphene structure 3, as shown in FIG. 5d. A sacrificial layer 8 is developed on an underside 1b lying opposite from top surface 1a of substrate 1 and structured. As illustrated in FIG. 5e, first the first layer 12 and then the second layer 11 of the substrate is partially removed with the aid of an etching method in a step S3d, so that catalyst structure 2 is at least regionally exposed. In this case second layer 12 may be used as an etch stop for a first etching step for the exposing of first layer 11. Subsequently, catalyst structure 2 is removed in a further method step S4 so that graphene structure 3 is exposed from the direction of an underside 1b of substrate 1. These method steps are illustrated in FIGS. 5e and 5f.

The position and size of a recess created in this way are able to be defined via photolithography. The exposing of substrate 1 may be carried out by, for example, wet-chemical etching, KOH etching or dry-chemical etching, in particular deep-reactive ion etching methods such as the Bosch process.

Figure 5F:
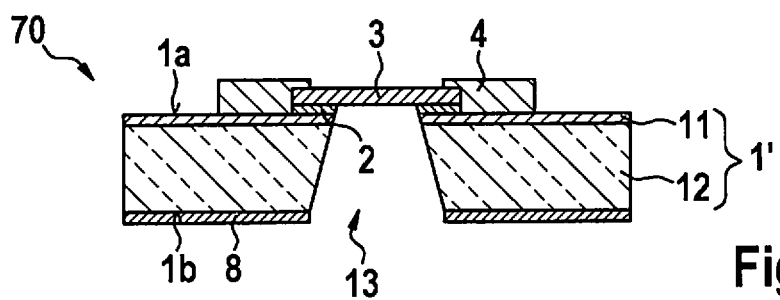

With the aid of the production method, a layer structure 70 which has a graphene diaphragm as illustrated in FIG. 5f is thus provided.

According to an advantageous further development, structuring of the graphene structure is also be able to be carried out only after the graphene structure has been grown.

According to an advantageous further development of the production method illustrated in FIGS. 5a through 5f, a protective layer 5 is deposited, like in FIG. 4c, which gives the graphene greater mechanical stability in backside etching step 5e and during the removal of catalyst structure 2. In a subsequent step, the protective layer is able to be removed in an etching step (for instance by a solvent for a polymer-based protective layer or by hydrofluoric acid for silicon dioxide) in order to expose the graphene diaphragm.

What is claimed is:

1. A production method for a layer structure, comprising:
providing a substrate, at least a top surface of the substrate being made from an electrically non-conductive material;
depositing a catalyst structure onto the top surface of the substrate;
depositing a graphene structure onto the catalyst structure;
at least partially removing the catalyst structure situated between the substrate and the graphene structure;
exposing the substrate from the direction of an underside that lies opposite from the top surface of the substrate so that the catalyst structure is at least regionally exposed, the graphene structure being at least regionally exposed during the partial removal of the catalyst structure, and
developing a lower protective coating of an insulating material on at least a subregion of the underside of the substrate and the exposed graphene structure.

2. The production method as recited in claim 1, further comprising:
developing at least one electrically conductive contact on at least a subregion of the graphene structure.

3. The production method as recited in claim 2, further comprising:
developing an upper protective coating on at least one of: a subregion of the electrically conductive contact and the graphene structure.

4. The production method as recited in claim 3, further comprising:
removing a subregion of the graphene structure not covered by the upper protective coating prior to the at least partial removal of the catalyst structure.

5. A production method for a layer structure, comprising:
providing a substrate, at least a top surface of the substrate being made from an electrically non-conductive material;

depositing a catalyst structure onto the top surface of the substrate;
depositing a graphene structure onto the catalyst structure;
at least partially removing the catalyst structure situated between the substrate and the graphene structure;
exposing the substrate from the direction of an underside that lies opposite from the top surface of the substrate so that the catalyst structure is at least regionally exposed, the graphene structure being at least regionally exposed during the partial removal of the catalyst structure, and
developing a contact coating of an electrically conductive material on at least one of: a subregion of the underside of the substrate and the exposed graphene structure.

* * * * *